United States Patent [19]

Koscica et al.

[11] Patent Number: 5,052,183
[45] Date of Patent: Oct. 1, 1991

[54] OPEN CRYOGENIC MICROWAVE TEST CHAMBER

[75] Inventors: Thomas E. Koscica, Clark; Richard W. Babbitt, Fair Haven; William C. Drach, Trenton, all of N.J.

[73] Assignee: The United States of America as represented by the Secretary of the Army, Washington, D.C.

[21] Appl. No.: 637,427

[22] Filed: Jan. 4, 1991

[51] Int. Cl.5 .............................................. F25B 19/00
[52] U.S. Cl. .................................... 62/51.1; 338/99 S; 374/176; 505/866; 505/891
[58] Field of Search ........................ 62/51.1; 333/99 S; 374/176; 505/866, 891

[56] References Cited

U.S. PATENT DOCUMENTS

| 3,441,881 | 4/1969 | Weissman | 333/99 S |
| 3,845,424 | 10/1974 | Martens | 333/99 S |
| 3,975,695 | 8/1976 | Hartman | 333/99 S |
| 4,498,046 | 2/1985 | Faris et al. | 62/51.1 |
| 4,571,954 | 2/1986 | Roberts et al. | 62/51.1 |

Primary Examiner—Ronald C. Capossela
Attorney, Agent, or Firm—Michael Zelenka; William H. Anderson

[57] ABSTRACT

A cryogenic microwave test chamber consists of a dry-sample receiving chamber which is partly immersed in liquid nitrogen. Waveguides from either end of the interior of the dry chamber are connected to and sealed to outgoing waveguides in regions immersed in the liquid nitrogen. Dry nitrogen is introduced through the waveguide and is circulated through the dry chamber to prevent condensation therein during cooling. A heat conductive metal tube surrounds the dry chamber and is spaced therefrom and acts as a heat barrier. Waveguide flanges on the opposite ends of the dry chamber slidably seal the chamber.

13 Claims, 2 Drawing Sheets

OPEN CRYOGENIC MICROWAVE TEST CHAMBER

GOVERNMENT INTEREST

The invention described herein may be manufactured, used, and licensed by or for the Government for governmental purposes without the payment to us of any royalty thereon.

FIELD OF THE INVENTION

This invention relates to a test chamber for testing electrical components and circuits at cryogenic temperatures and more specifically to an inexpensive open cryogenic test chamber which offers easy access to a test compartment.

BACKGROUND OF THE INVENTION

A low temperature test chamber is needed to test cryogenic devices or circuits such as superconducting microwave devices. By low temperature is meant temperatures less than about 100° K. Prior art cryogenic test chambers employ vacuum chambers. Vacuum chambers are expensive and great care and special fixtures are required to maintain the vacuum. Changing samples is very time consuming since the vacuum must be released and then reestablished when a test sample is replaced. The interior volume of a vacuum cryogenic test chamber is also limited to reduce the above problems, thus limiting the size of the test circuit which can be received by the chamber.

SUMMARY OF THE INVENTION

A novel open cryogenic test chamber is provided which contains an open pool of liquid nitrogen. A dry sample chamber, which carries the sample to be tested, is at least partially immersed in the liquid nitrogen pool. The sample may be cooled by the liquid nitrogen to about 77° K. A dry sample chamber is needed to test circuits which are adversely affected by moisture.

The dry sample chamber has flat waveguide flanges at either end which allow the waveguide to slip back and forth through the walls, adjusting for different sample sizes, while being snug enough to prevent liquid nitrogen from entering the dry chamber. Waveguide joints, which are immersed in the liquid nitrogen, are sealed with an insulation foam sealant.

To eliminate moisture in the dry chamber, which can condense on the test structure as the chamber is cooled, dry nitrogen gas is fed into the waveguide through microwave directional couplers at areas upstream and downstream of the open cryogenic coupler and is circulated through the dry chamber.

A heat shield, consisting of a copper band encircling and spaced from the inside wall of the cryogenic chamber, produces an additional temperature drop in the dry chamber by lowering the temperature of the gas layer above the liquid nitrogen pool. A removable lid on the open chamber also produces an additional temperature drop.

The device of the present invention permits rapid and simple replacement of test samples and overcomes the limitation of a small test chamber size. Thus, the dry chamber allows testing of microwave circuits with areas as large as 4 inches by 6 inches at temperatures of 77° K. It is also much less costly than known vacuum systems and permits replacement of test samples more quickly than in the prior art.

The objects, advantages, and features of the present invention will be better understood when considered in connection with the appended drawings in which:

DETAILED DESCRIPTION

Figure 1:
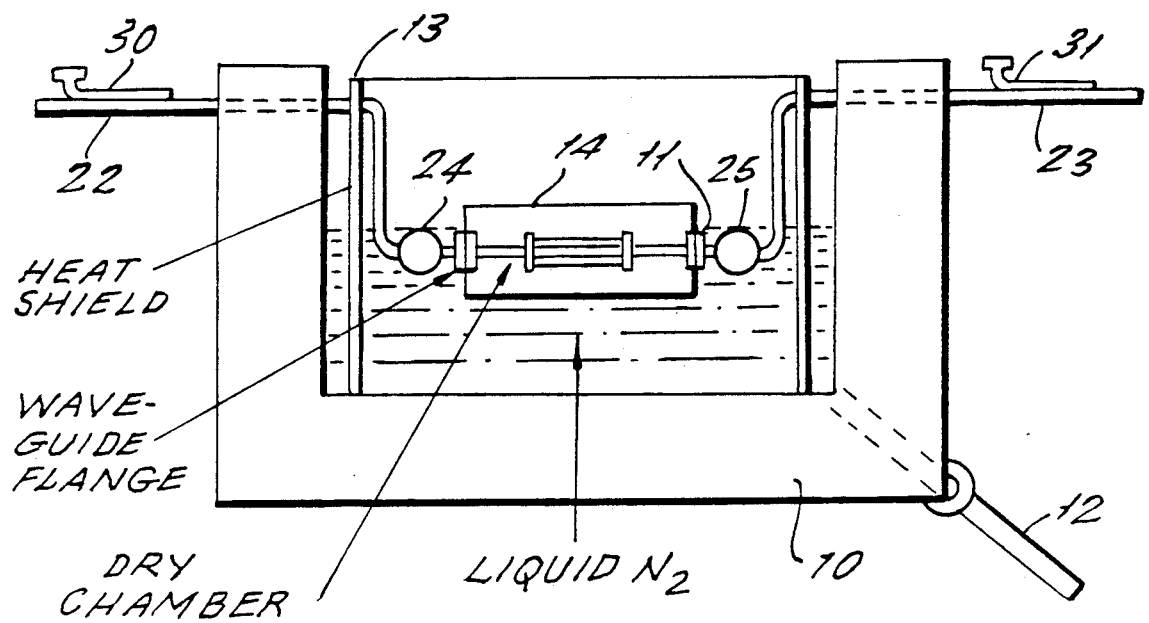
FIG. 1 is a side schematic cross-sectional view of the cryogenic chamber of the invention.
Figure 2:
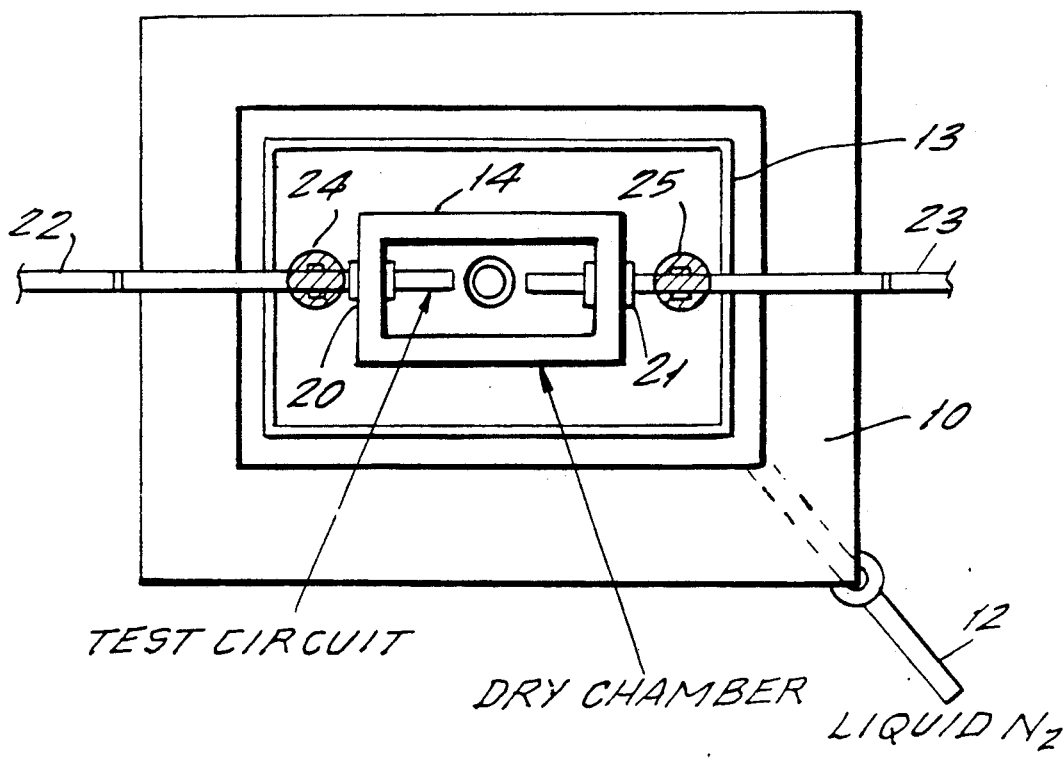
FIG. 2 is a top view of FIG. 1.

Referring now to FIGS. 1 and 2, the novel open chamber 10 may be formed of an open topped box of styrofoam. The box or chamber 10 is made impervious to liquid nitrogen and may be formed of sections of styrofoam having a thickness of about 3 inches, bonded together by a suitable cement. Good results were obtained with "Great Stuff Insulating Foam Sealant", made by Insta-Foam Products, Inc. The interior of the chamber may be about 22 by 15 inches in area and about 7 inches in depth. Chamber 10 is then filled to a height of about 4 inches with liquid nitrogen, which is loaded into container 10 as desired, to the height 11.

Preferably, the open top chamber is covered with a removable lid having a thickness of 3 inches. A liquid nitrogen outlet conduit 12 is formed through and sealed to container 10 to permit the convenient removal of liquid nitrogen from the interior of the container 10.

A rectangular tube of copper 13 is fixed to the bottom of container 10 and acts as a heat shield, as will be later described. Copper tube 13 may have openings, not shown, to permit the easy flow of liquid nitrogen between its exterior and interior.

Figure 3A:
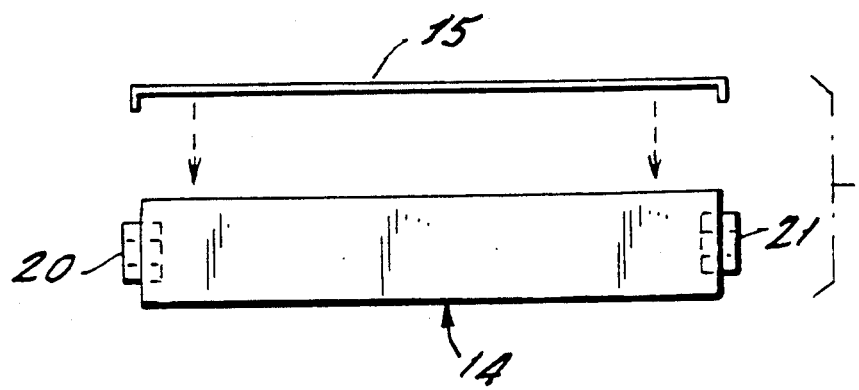
FIG. 3a is an elevational view of the dry chamber with the lid spaced above the top of the dry chamber.
Figure 3B:
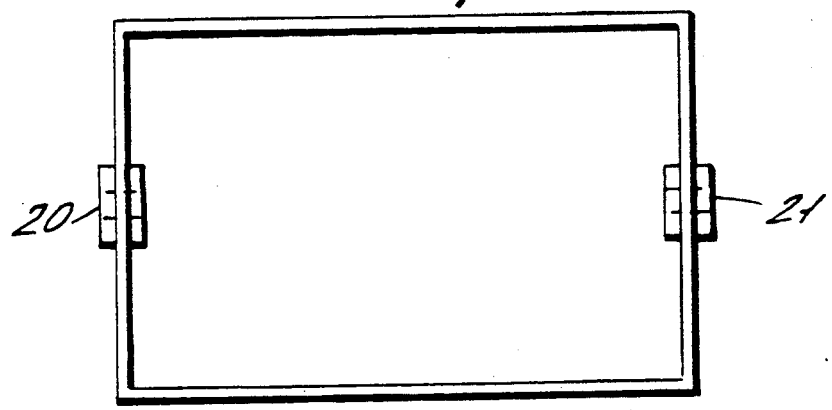
FIG. 3b is a top view of FIG. 3.

A dry test chamber 14 (FIGS. 3a and 3b) is then at least partly immersed in the liquid nitrogen as shown in FIG. 1. Its top is closed by removable lid 15, shown in FIG. 3a. Test chamber 14 is sealed against infiltration of liquid nitrogen and contains the test circuit in a dry environment. Chamber 14 is provided with flat waveguide flanges 20 and 21 at either end. The flat waveguide flanges allow the waveguide to slip back and forth through the wall of the dry chamber, adjusting for different sample sizes, but is snug enough to seal the dry chamber.

In the preferred embodiment of the invention, more than about one-half and approximately five-eighths of the dry container is immersed beneath surface 11 of the liquid nitrogen. The dry container 14 has an interior area of six (6) by eight (8) inches and a depth of about 2.5 inches, and is capable of measuring circuits as large as four (4) inches by six (6) inches.

Waveguides 22 and 23 extend through the walls of container 10 as shown, above the level 11 of liquid nitrogen. The waveguide connectors 24 and 25 to the waveguides extending into dry chamber 14 are submerged below level 11 and are sealed by a suitable foam sealant such as Great Stuff Foam Sealant referred to previously.

In order to load a sample into dry chamber 14, liquid nitrogen may be drained via drain 12, the sample may be loaded, and the chamber 10 refilled with liquid nitrogen. Alternatively, the waveguides can be disconnected and the dry chamber can be removed for loading and unloading.

To eliminate moisture in the dry chamber 14, a flow of dry nitrogen gas is introduced into the chamber through waveguides 22 and 23. The gas is conveniently applied to the waveguides 22 and 23 through microwave directional couplers 30 and 31 respectively (FIG. 1). Dry nitrogen gas in the dry chamber 14 prevents condensation on the test circuit during cooling.

When using the novel test chamber of the invention, the liquid nitrogen alone produces a temperature of about 89° K. in the dry chamber 14. The heat shield 13 permits a further temperature drop of about 10° K. to about 79° K. This is because heat shield 13 conducts "cold" from the bottom of chamber 10 to its top, thus further cooling the gas around dry chamber 14. In addition, shield 13 tends to prevent the warmer nitrogen gas in regions closer to the interior walls of container 10 due to heat penetration from the room from reaching the dry chamber 14. A last 2° K. drop to 77° K. can be achieved by placing lid 15 over the dry chamber.

In operation, the dry chamber 14 may be removed from chamber 10 as previously described. A microwave circuit is then loaded into the dry chamber 14 and is connected to the waveguide with suitable microwave transitions in the interior of the dry chamber 14, and chamber 14 is reinstalled in chamber 10.

By then using known sweep generators and waveguide sizes it is possible to test the microwave circuits at all frequencies up to 100 gigahertz at 77° K.

Although the present invention has been described in relation to a particular embodiment thereof, many other variations and modifications and other uses will become apparent to those skilled in the art. It is preferred, therefore, that the present invention be limited not by the specific disclosure herein, but only by the appended claims.

What is claimed is:

1. An open cryogenic chamber for testing superconducting apparatus comprising, in combination, an open topped chamber which is filled to a given level with a liquid gas; a dry chamber partially immersed in said open topped chamber and adapted to receive superconducting apparatus to be tested under low temperature conditions; first and second waveguides entering said open topped chamber; third and fourth waveguides fixed to and extending through end walls of said dry chamber and coupled to said first and second waveguides, respectively, which enter said open topped chamber; sealing means for forming a fluid tight seal at the regions coupling said waveguides; and coupling means within said dry chamber for coupling superconducting apparatus to be tested to said third and fourth waveguides which are fixed to said ends of said dry chamber.

2. The apparatus of claim 1, wherein said third and fourth waveguides secured to said ends of said dry chamber have flat waveguide flanges which sealably and slidably engage the walls of said dry chamber to permit adjustment for sample size and sealing of said dry chamber.

3. The apparatus of claim 2, wherein said liquid gas is nitrogen.

4. The apparatus of claim 1 which further includes a thin wall heat conductive tube which encircles said dry chamber and is radially spaced therefrom and extends for at least the full height of said dry chamber.

5. The apparatus of claim 3, which further includes a thin wall heat conductive tube which encircles said dry chamber and is radially spaced therefrom and extends for at least the full height of said dry chamber; said shield functioning to equalize the temperature of said liquid gas from the bottom to the top of said open topped chamber and to act as a barrier against the infiltration of heated gas from the adjacent interior walls of said open topped chamber to the interior regions thereof which contain said dry chamber.

6. The apparatus of claim 5, wherein said third and fourth waveguides secured to said ends of said dry chamber have flat waveguide flanges which sealably and slidably engage the walls of said dry chamber to permit adjustment for sample size and sealing of said dry chamber.

7. The apparatus of claim 1, wherein all of said waveguides define continuous gas conduction-path in communication with the interior of said dry chamber; and means for connecting a source of dry gas under pressure to said first waveguide in a region outside of the volume of liquid gas and for venting dry gas from said second waveguide, whereby a flow of dry gas can be established through said dry chamber to prevent condensation therein during cooling of the interior of said dry chamber.

8. The apparatus of claim 7, wherein said dry gas is nitrogen.

9. The apparatus of claim 7, wherein said third and fourth waveguides secured to said ends of said dry chamber have flat waveguide flanges which sealably and slidably engage the walls of said dry chamber to permit adjustment for sample size and sealing of said dry chamber.

10. The apparatus of claim 8, wherein said liquid gas is nitrogen.

11. The apparatus of claim 7, which further includes a thin wall heat conductive tube which encircles said dry chamber and is radially spaced therefrom and extends for at least the full height of said dry chamber.

12. The apparatus of claim 7, which further includes a thin wall heat conductive tube which encircles said dry chamber and is radially spaced therefrom and extends for at least the full height of said dry chamber; said shield functioning to equalize the temperature of said liquid gas from the bottom to the top of said open topped chamber and to act as a barrier against the infiltration of heated gas from the adjacent interior walls of said open topped chamber to the interior regions thereof which contain said dry chamber.

13. The apparatus of claim 12, wherein said third and fourth waveguides secured to said ends of said dry chamber have flat waveguide flanges which sealably and slidably engage the walls of said dry chamber to permit adjustment for sample size and sealing of said dry chamber.

* * * * *